(12) United States Patent
Crippa et al.

(10) Patent No.: US 9,438,182 B2
(45) Date of Patent: Sep. 6, 2016

(54) DIGITAL CLASS-D AMPLIFIER AND DIGITAL SIGNAL PROCESSING METHOD

(71) Applicant: ST-Ericsson SA, Plan-les-Ouates (CH)

(72) Inventors: Carlo Crippa, Merate (IT); Rossella Bassoli, Monza (IT)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 14/358,182

(22) PCT Filed: Oct. 30, 2012

(86) PCT No.: PCT/EP2012/071484
§ 371 (c)(1),
(2) Date: May 14, 2014

(87) PCT Pub. No.: WO2013/072186
PCT Pub. Date: May 23, 2013

(65) Prior Publication Data
US 2014/0347128 A1 Nov. 27, 2014

Related U.S. Application Data

(60) Provisional application No. 61/593,621, filed on Feb. 1, 2012.

(30) Foreign Application Priority Data

Nov. 17, 2011 (IT) .............................. RM2011A0609

(51) Int. Cl.
*H03F 3/38* (2006.01)
*H03F 3/185* (2006.01)
(Continued)

(52) U.S. Cl.
CPC ............ *H03F 3/185* (2013.01); *H03F 3/2175* (2013.01); *H03K 7/08* (2013.01);
(Continued)

(58) Field of Classification Search
CPC .................................. H03F 3/38; H03F 3/217
USPC ....................................... 330/10, 251, 207 A
See application file for complete search history.

(56) References Cited

U.S. PATENT DOCUMENTS 6,498,531 B1   12/2002  Ulrick et al.
6,943,620 B2 *  9/2005  Andersen et al. .............. 330/10
(Continued)

OTHER PUBLICATIONS

Berkhout, M., et al., "Class-D Audio Amplifiers in Mobile Applications", IEEE Transactions on Circuits and Systems I: Regular Papers, May 1, 2010, pp. 992-1002, vol. 57,Issue: 5, IEEE.
(Continued)

*Primary Examiner* — Henry Choe
(74) *Attorney, Agent, or Firm* — Coats & Bennett, P.L.L.C.

(57) ABSTRACT

A digital class D amplifier (10) is disclosed, comprising a pulse width modulator (PW Mod) comprising: a digital loop filter (Loop F) adapted to receive an input signal (x[n]) and a feedback signal (fb[n]), the digital loop filter (Loop_F) being adapted to process at a clock frequency (f_s) said input and feedback signals for providing as output a filtered digital signal (w[n]); a PWM conversion module (PW_CM) having an input (24) for receiving the filtered digital signal (w[n]) and having a first output (25) connected to the digital loop filter (Loop F), the PWM conversion module being adapted for processing the filtered digital signal (w[n]) and providing at said first output (25) the feedback signal (fb[n]). The PWM conversion module (PW_CM) comprises: a first comparator (CMP_N) adapted to compare the filtered digital signal (w[n]) with a first reference triangular waveform (VTn[n]) for providing as output a first PWM signal (yn[n]), the first reference triangular waveform having a frequency (f_osc) much lower than said clock frequency (f.s); a second comparator (CMP_P) adapted to compare the filtered digital signal (w[n]) with a second reference triangular waveform (VTp[n]) for providing as output a second PWM signal (yp[n]), the second reference triangular waveform (VTp[n]) being the inverse of the first triangular waveform (VTn[n]), said first (yn[n]) and second (yp[n]) PWM signals representing a differential output pulse width modulated signal (yn[n],yp[n]).

12 Claims, 2 Drawing Sheets

(51) Int. Cl.
  *H03F 3/217*  (2006.01)
  *H03K 7/08*  (2006.01)
(52) U.S. Cl.
  CPC .... *H03F 2200/351* (2013.01); *H03F 2200/78* (2013.01); *H03F 2203/21112* (2013.01); *H03F 2203/21196* (2013.01)

(56) References Cited

U.S. PATENT DOCUMENTS

| | | | | |
|---|---|---|---|---|
| 7,355,473 | B2* | 4/2008 | Wu | 330/10 |
| 7,795,962 | B2* | 9/2010 | Park | 330/10 |
| 7,852,156 | B1* | 12/2010 | Chen et al. | 330/251 |
| 8,912,833 | B2* | 12/2014 | Braun | 327/172 |
| 2009/0039957 | A1* | 2/2009 | Lin | 330/10 |

OTHER PUBLICATIONS

Wang, M., "A 120 dB Dynamic Range 400 mW Class-D Speaker Driver With Fourth-Order PWM Modulator", IEEE Journal of Solid-State Circuits, Aug. 1, 2010, pp. 1427-1435, vol. 45, Issue: 8, IEEE.

Ihs, H., et al., "Digital-input Class-D Audio Amplifier", Convention Paper 8128, presented at the 128th Convention, May 22, 2010, pp. 1-12, Audio Engineering Society, London, UK.

Cellier, R. et al., "A Fully Differential Digital Input Class D with EMI Spreading Method for Mobile Application", AES 37th International Conference: Class D Audio Amplification, Aug. 28, 2009, pp. 1-9, AES.

* cited by examiner

DIGITAL CLASS-D AMPLIFIER AND DIGITAL SIGNAL PROCESSING METHOD

TECHNICAL FIELD

The present disclosure relates to the field of signal processing and more in particular concerns a digital class D amplifier and a digital signal processing method.

BACKGROUND ART

A class D amplifier, or switching amplifier, is a circuit based on a Pulse Width Modulation (PWM) technique, in which the amplitude of an input signal to be amplified is converted into the duty cycle of a reference high frequency signal. Class D amplifiers are well known for having a much higher power efficiency than conventional class A and B amplifiers.

The performances of the class D amplifiers in terms of noise floor and total harmonic distortion versus the level of the input signal are strictly dependent on the accurateness in the determination of the duty cycle through the pulse width modulator.

Almost all known class D amplifiers make use of a Delta-Sigma loop in order to minimize the errors made in the determinations of the output duty cycle. In general, a known way to improve the performances of the pulse width modulator is to equip such modulator with a feedback loop and a loop filter. Due to the presence of the feedback loop and loop filter, one of the main issue in a class D amplifier with feedback loop and loop filter is to preserve the stability of the loop. For this purpose, an important design variable is the input dynamic range of the amplifier.

A prior art digital class D amplifier is disclosed in a first paper, namely "*A 120 dB Dynamic Range 400 mW Class-D Speaker Driver With Fourth-Order PWM Modulator*", W. Wang, X. Jiang, J. Song and T. L. Brooks, IEEE Journal of Solid-State Circuits, vol. 45, No. 8, August 2010. In particular the above first paper, with reference to FIG. 5 thereof, discloses a class D amplifier with a pulse width modulator, based on a delta sigma loop architecture, comprising a digital loop filter and a feedback loop adapted to feedback the output pulse-width modulated signal at the input of the digital loop filter. According to the paper, the above class D amplifier attains high performances, due to the feedback of the output of the pulse width modulator and due to correction performed by the delta sigma loop. However, in practical implementations, due to some constraints on the sampling frequency of the input signal and on the frequency of the reference signal, the output signals may show unwanted spikes. The above problem depends also on the level of the input signal and is more accentuated for input samples having relatively high values. The level of the input signal is furthermore constrained by the need to preserve the stability of the loop.

Some examples of class-D amplifier architectures are disclosed in a second paper, namely "*Class-D Audio Amplifiers in Mobile Applications*", Marco Berkhout et al, IEEE TRANSACTIONS ON CIRCUITS AND SYSTEM, VOL. 57, NO. 5, 1 May 2010.

SUMMARY OF THE INVENTION

It is an object of the present invention to provide a digital class D amplifier that, with respect to the class D amplifier disclosed in the above mentioned first paper, is adapted to guarantee improved performances in terms of spike free outputs and loop stability.

The above object is reached by a digital class D amplifier comprising a pulse width modulator. The pulse width modulator comprises a digital loop filter having first input adapted to receive an input signal and a second input adapted to receive a feedback signal. The digital loop filter is adapted to process at a clock frequency said input and feedback signals for providing as output a filtered digital signal. The pulse width modulator comprises a PWM conversion module having an input for receiving the filtered digital signal and having a first output connected to the second input of the digital loop filter. The PWM conversion module is adapted to process the filtered digital signal for providing at said first output the feedback signal. The PWM conversion module comprises a first and a second comparator adapted to compare the filtered digital signal with a first and a second reference triangular waveform for providing as output a first PWM signal and second PWM signal in their combination representing a differential output pulse width modulated signal. Said reference triangular waveforms have a frequency much lower than the clock frequency. The second reference triangular waveform is the inverse of the first triangular waveform. The pulse width modulator comprises an algebraic adder adapted to receive as inputs said first and said second PWM signals for providing as output said feedback signal.

The above object is also reached by digital signal processing method for processing an input digital signal and obtaining an output pulse width modulated signal comprising the steps of:

digital loop filtering the input signal and a feedback signal at a clock frequency for providing as output a filtered digital signal;

processing the filtered digital signal for providing as output the feedback signal.

The processing step comprises:

comparing the filtered digital signal with a first reference triangular waveform for providing as output a first PWM signal, said waveform having a frequency much lower than the clock frequency;

comparing the filtered digital signal with a second reference triangular waveform for providing as output a second PWM signal, the second reference triangular waveform being the inverse of the first triangular waveform;

algebraically adding the first PWM signal to the second PWM signal for obtaining the feedback signal.

The output pulse width modulated signal is a differential signal comprising said first and second PWM signals.

BRIEF DESCRIPTION OF THE DRAWINGS

Further features and advantages of the present invention will become more apparent from the following detailed description of exemplary but non-limiting embodiments thereof, as illustrated in the attached figures, in which.

DETAILED DESCRIPTION

In the attached figures similar or identical elements are indicated using the same reference numbers.

Figure 1:
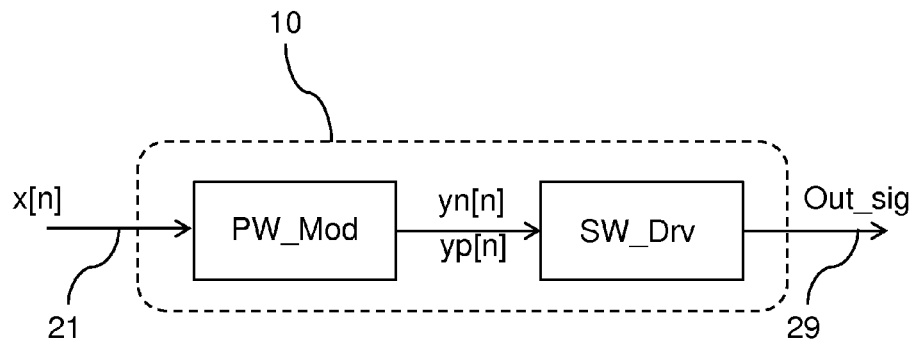
FIG. 1 shows a very schematic view of a digital class D amplifier comprising a pulse width modulator and a switching diver.

FIG. 1 shows a very schematic view of an embodiment of a digital class D amplifier 10 comprising pulse-width modulator PW_Mod and a switching driver SW_Drv. According to an embodiment, without for this reason introducing any limitation, the digital class D amplifier is an audio amplifier. In this case, without introducing any limitation, the digital class D amplifier can be integrated in a mobile phone platform.

According to a variant embodiment the switching driver SW_drv can be replaced by a differential buffer adapted to drive a load, for example a loudspeaker.

The digital class D amplifier 10 has an input for receiving an input digital signal x[n] at a clock frequency fs. In other words, at each clock cycle of the signal fs one input sample of the input digital signal x[n] is received at input 22 of the digital class D amplifier 10. The digital class D amplifier 10 is adapted to process the input digital signal x[n] at a clock frequency fs, namely at each clock cycle one input sample of the input digital signal is processed, and to provide at its output 29 an output signal Out_sig. The output signal Out_sig is adapted to drive a load, for example a loudspeaker.

Figure 2:
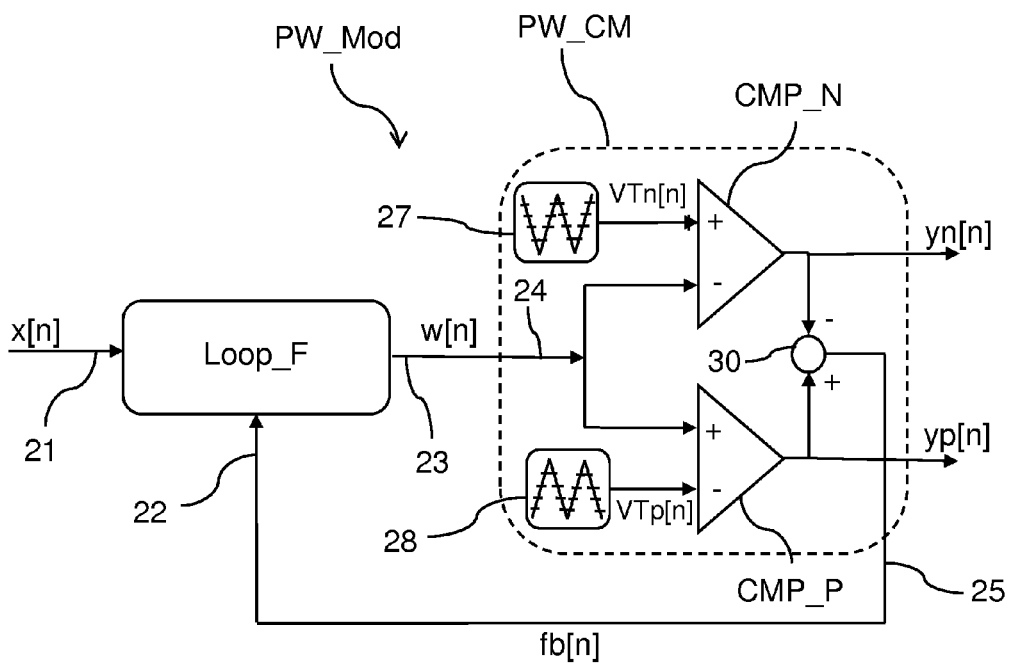
FIG. 2 shows a schematic block diagram of an embodiment of the pulse width modulator of FIG. 1, said pulse modulator comprising a digital loop filter and a PWM converter.

With reference to FIGS. 1 and 2, the digital class D amplifier 10 comprises a pulse width modulator PW_Mod.

The pulse width modulator PW_Mod comprises a digital loop filter Loop_F having a first input 21, which in this example represents also the input of the digital class D amplifier 10, adapted to receive an input signal x[n] and a second input 22 adapted to receive a feedback signal fb[n]. The digital loop filter Loop_F is adapted to process, at the clock frequency f_s, the input x[n] and feedback fb[n] signals for providing as output a filtered digital signal w[n]. In the example shown in FIG. 2, the filtered digital signal w[n] is provided at the output 23 of the digital loop filter Loop_F.

The pulse width modulator PW_Mod comprises a PWM conversion module PW_CM having an input 24, connected to the output 23 of the digital loop filter Loop_F, for receiving the filtered digital signal w[n]. The PWM conversion module PW_CM comprises a first output 25 connected to the second input 22 of the digital loop filter Loop_F and is adapted to process the filtered digital signal w[n] in order to provide at said first output 25 the feedback signal fb[n]. In other words, the output 25 of the PWM converter PW_CM is connected to the second input 22 of the digital loop filter Loop_F.

The PWM conversion module PW_CM comprises a first comparator CMP_N, in particular a digital comparator, adapted to compare the filtered digital signal w[n] with a first reference triangular waveform VTn[n] for providing as output a first PWM signal yn[n]. The above comparison is clocked by the clock frequency f_s, while the frequency f_osc of the first reference triangular waveform VTn[n] is much lower than the clock frequency f_s. For example, without for this reason introducing any limitation, f_osc=f_s/36.

The PWM conversion module PW_CM comprises a second comparator CMP_P, in particular a digital comparator, adapted to compare the filtered digital signal w[n] with a second reference triangular waveform VTp[n] for providing as output a second PWM signal yp[n]. The second reference triangular waveform VTp[n] is the inverse of the first triangular waveform VTn[n].

The first and the second PWM output signals in their combination represent a differential output pulse width modulated signal yp[n], yn[n]. Both the first and the second PWM output signals are digital signals that, depending on the results of the comparisons performed by the comparators, can have "1" and "0" logic levels. In the example shown, also with reference to FIG. 1, the above mentioned output pulse width modulated signal yp[n], yn[n] is sent to the switching driver SW_Drv. It is clear that in this case, the switching driver SW_Drv is a differential switching driver SW_Drv and has a first input for receiving the first PWM signal yn[n] and a second input for receiving the second PWM signal yp[n].

The PWM conversion module PW_CM comprises an algebraic adder 30 adapted to receive as inputs the first yn[n] and the second yp[n] PWM signals for providing as output, in the example of FIG. 2 at output 25 of the PWM conversion module PW_CM, the feedback signal fb[n].

According to an embodiment, the algebraic adder 30 is adapted to provide the feedback signal fb[n] to be sent to the digital loop filter Loop_F as the digital difference between the first yn[n] and the second yp[n] output PWM signals. In this case, the feedback signal fb[n] can selectively have the following values/levels: "1", "0" and "−1". It is to be observed that, in this case, the first yn[n] and second yp[n] PWM signals represent a quaternary PWM modulation of the filtered digital signal w[n].

Figure 3:
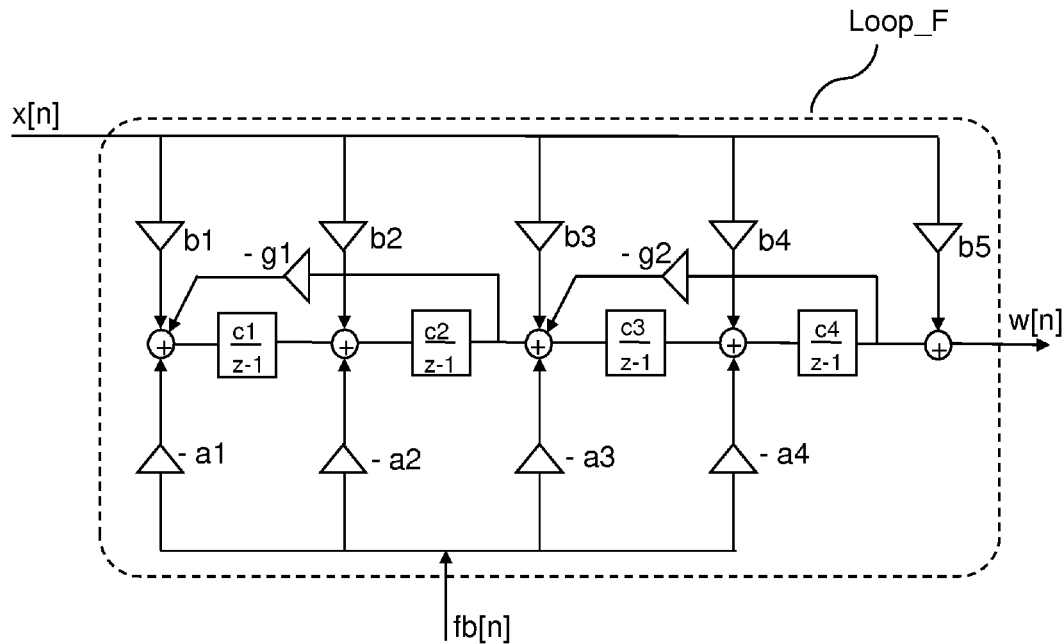
FIG. 3 shows a schematic block diagram of an embodiment of the digital loop filter of FIG. 2.

With reference to FIG. 3, according to an embodiment, the digital loop filter Loop_F is a cascade of integrators with feedback—CIFB—filter. The particular digital loop filter Loop_F shown in FIG. 3 is a CIFB filter of the $4^{th}$ order. Since the structure and the operation of a CIFB filter is well known to a man skilled in the field, for example known from the above paper indicated in the above section "background art", the description of such filter will not be further detailed. For example, with reference to FIG. 3, it is clear that in the case in which the digital class D amplifier 10 is an audio amplifier, the parameters a1-a4, b1-b5, c1-c4 and g1-g2 are design parameters that can be determined by a man skilled in the field in order to shape the noise outside the 0-20 KHz audio band.

Moreover, it must be clear that according to variant embodiments, alternative kinds of loop filters Loop_F can be employed. For example, according to a variant embodiment the digital loop filter Loop_F is a cascade of integrators with feedforward—CIFF—filter.

Figure 4:
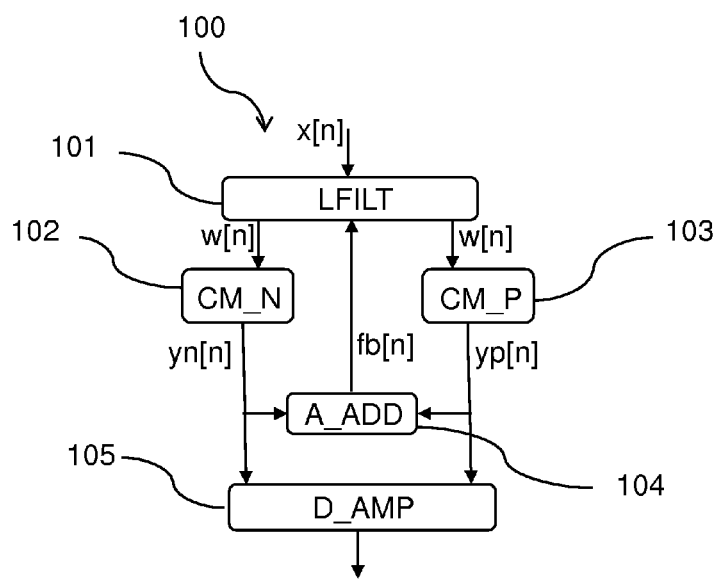
FIG. 4 shows a schematic flow chart of a digital signal processing method that can be performed in the class D amplifier of FIG. 1.

FIG. 4 shows a simplified flow chart of a method 100 of processing an input digital signal x[n] for obtaining output pulse modulated signal yp[n], yn[n]. The processing method 100 comprises the steps of:

digital loop filtering LFILT 101 the input signal x[n] and a feedback signal fb[n] for providing as output a filtered digital signal w[n]; and processing 102, 103, 104, 105 the filtered digital signal w[n] for providing as output the feedback signal fb[n].

The processing step 102, 103, 104, 105 comprises:

comparing 102 the filtered digital signal w[n] with a first reference triangular waveform for providing as output a first PWM signal yn[n];

comparing 103 the filtered digital signal w[n] with a second reference triangular waveform for providing as output a second PWM signal yp[n], the second reference triangular waveform being the inverse of the first triangular waveform;

algebraically adding 104 said first PWM signal yn[n] to said second PWM signal yp[n] for obtaining said feedback signal fb[n].

The output pulse modulated signal yp[n], yn[n] is a differential signal comprising said first yn[n] and second yp[n] PWM signal.

According to an embodiment, the processing method 100 comprises a step D_AMP 104 of driving, directly or indirectly, a load with said differential signal comprising said first yn[n] and second yp[n] PWM signals. For example, the driving step D_AMP can include of step of driving a load, for example a loudspeaker, through a differential switching driver SW_Drv or through a differential buffer.

Further features and embodiments of the above method can be derived directly by features and embodiments already detailed for the pulse width modulator described with reference to FIG. 2 and the digital class D amplifier described with reference to FIG. 1.

Simulation results have proved that the above described class D amplifier and processing method fully reach the proposed objectives.

For example, a simulation has been performed with an input signal obtained sampling a sinewave of 200 ms, having a frequency of 1 kHz with a sampling frequency f_s of 24 MHz. The samples have been fed to both the prior art class D amplifier disclosed in the paper mentioned in the Background Section (single-ended class D amplifier) and to a class D amplifier as described in the present application (differential class D amplifier). The first and second triangular waveforms VTn[n] and VTp[n] have been set so to have a frequency $f\_osc=F\_s/36=667$ kHz. The digital loop filter in both cases was a $4^{th}$ order CFIB of the kind shown in FIG. 3 whose design parameters have been set in order to shape the noise outside the 0-20 kHz audio band. The performances have been evaluated in terms of the following measurements:

Thd=Total harmonic distortion;
N=noise floor;
Lssf=maximum level for stable loop and spike free output;
Ls=maximum level for stable loop.

The following table reports the results obtained for the above simulation:

| Class D amplifier | Ls | lssf | Thd | N |
|---|---|---|---|---|
| Single ended | −3.4 dBfs | −6.5 dBfs | −119.7 dB | −117.8 dB |
| Differential | −0.5 dBfs | −0.5 dBfs | −121.9 dB | −123.4 dB |

The above table clearly shows the impressive advantages of the class D amplifier and processing method disclosed in the present application, mainly in terms of noise floor and maximum input level achievable with loop stability and spike-free outputs. From the point of view of the complexity/area occupation, the additional costs in order to obtain the above impressive advantages are negligible and mainly due to the additional comparator and algebraic adder.

Moreover, the digital class D amplifier of the present disclosure can be easily used to manage more channels, i.e. more signal paths. For example, in a mobile phone platform with a basic clock of 38.4 MHz, it is possible to use the same hardware to implement 3 channels at $f\_s=38.4$ MHz/3=12.8 MHz; still in this example the triangular reference signal frequency would be set at $f\_osc=f\_s/34=376.5$ KHz. For each 12.8 MHz period three channels are than computed serially by using the same hardware structure, one for each 38.4 MHz clock cycle.

Naturally, in order to satisfy contingent and specific requirements, a person skilled in the art may apply to the above-described digital class D amplifier and digital processing method many modifications and variations, all of which, however, are included within the scope of protection of the invention as defined by the following claims.

The invention claimed is:

1. A digital class D amplifier comprising a pulse width modulator (PWM) comprising:
    a digital loop filter having a first input configured to receive an input signal and a second input configured to receive a feedback signal, the digital loop filter configured to process, at a clock frequency, the input and feedback signals to output a filtered digital signal; and
    a PWM conversion module having an input for receiving the filtered digital signal and having a first output connected to the second input of the digital loop filter, the PWM conversion module configured to process the filtered digital signal and provide at the first output the feedback signal, said PWM conversion module comprising:
        a first comparator configured to compare the filtered digital signal with a first reference triangular waveform to provide a first PWM signal, the first reference triangular waveform having a frequency substantially lower than the clock frequency;
        a second comparator configured to compare the filtered digital signal with a second reference triangular waveform to provide a second PWM signal, the second reference triangular waveform being the inverse of the first triangular waveform, and the first and second PWM signals representing in their combination a differential output pulse width modulated signal; and
        an algebraic adder having a first input coupled to an output of the first comparator and a second input coupled to an output of the second comparator, the algebraic adder configured to combine the first and said second PWM signals to provide the feedback signal.

2. The digital class D amplifier according to claim 1, further comprising one of a differential switching driver and a digital buffer, wherein the one of the differential switching driver and the digital buffer includes a first input for receiving the first PWM signal and a second input for receiving the second PWM signal.

3. The digital class D amplifier according to claim 1, wherein the digital loop filter comprises a cascade of integrators with feedback (CIFB) filter.

4. The digital class D amplifier according to claim 3, wherein the CIFB filter comprises a 4th order filter.

5. The digital class D amplifier according to claim 1, wherein the digital loop filter comprises a cascade of integrators with feedforward (CIFF) filter.

6. The digital class D amplifier according to claim 1, wherein the algebraic adder provides the feedback signal as the digital difference between the first and second PWM signals.

7. The digital class D amplifier according to claim 6, wherein the feedback signal can selectively have the following values: "1", "0" and "−1".

8. The digital class D amplifier according to claim 7, wherein the first and second PWM signals represent a quaternary PWM modulation of the filtered digital signal.

9. A mobile phone platform comprising a digital class D amplifier comprising a pulse width modulator (PWM), the digital class D amplifier comprising:
- a digital loop filter having a first input configured to receive an input signal and a second input configured to receive a feedback signal, the digital loop filter configured to process, at a clock frequency, the input and feedback signals to output a filtered digital signal; and
- a PWM conversion module having an input for receiving the filtered digital signal and having a first output connected to the second input of the digital loop filter, the PWM conversion module configured to process the filtered digital signal and provide at the first output the feedback signal, said PWM conversion module comprising:
  - a first comparator configured to compare the filtered digital signal with a first reference triangular waveform to provide a first PWM signal, the first reference triangular waveform having a frequency substantially lower than the clock frequency;
  - a second comparator configured to compare the filtered digital signal with a second reference triangular waveform to provide a second PWM signal, the second reference triangular waveform being the inverse of the first triangular waveform, and the first and second PWM signals representing in their combination a differential output pulse width modulated signal; and
  - an algebraic adder having a first input coupled to an output of the first comparator and a second input coupled to an output of the second comparator, the algebraic adder configured to combine the first and said second PWM signals to provide the feedback signal.

10. A digital signal processing method for processing an input digital signal and obtaining an output pulse width modulated (PWM) signal, the method comprising:
- digital loop filtering, at clock frequency, the input digital signal and a feedback signal to provide a filtered digital signal;
- processing the filtered digital signal to provide the feedback signal;
- wherein processing the filtered digital signal comprises:
  - comparing the filtered digital signal with a first reference triangular waveform, in a first comparator, to provide a first PWM signal, the first reference triangular waveform having a frequency substantially lower than the clock frequency;
  - comparing the filtered digital signal with a second reference triangular waveform, in a second comparator, to provide a second PWM signal, the second reference triangular waveform being the inverse of the first triangular waveform;
  - algebraically combining the first PWM signal and the second PWM signal to obtain the feedback signal in an algebraic adder, said algebraic adder having a first input coupled to an output of the first comparator and a second input coupled to an output of the second comparator;
  - wherein the output pulse width modulated signal comprises a differential signal comprising the first and second PWM signals.

11. The digital signal processing method according to claim 10, further comprising driving a load with the differential signal comprising the first and second PWM signals.

12. The digital class D amplifier according to claim 1, wherein the algebraic adder is configured to algebraically add the first and the second PWM signals, and wherein the algebraically added first and second PWM signals generates the feedback signal.

* * * * *